(12) United States Patent
Liu et al.

(10) Patent No.: US 9,640,590 B2
(45) Date of Patent: May 2, 2017

(54) ORGANIC LIGHT-EMITTING DIODE DISPLAY AND FABRICATION METHOD THEREOF

(71) Applicant: TPK Touch Solutions Inc., Taipei (TW)

(72) Inventors: Chen-Yu Liu, Taoyuan (TW); Hung-Chieh Lu, Hsinchu (TW); Hsi-Chien Lin, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

(21) Appl. No.: 14/481,871

(22) Filed: Sep. 9, 2014

(65) Prior Publication Data
US 2015/0069365 A1  Mar. 12, 2015

(30) Foreign Application Priority Data
Sep. 9, 2013 (CN) .......................... 2013 1 0409769

(51) Int. Cl.
*H01L 29/08* (2006.01)
*H01L 27/32* (2006.01)
*H01L 51/52* (2006.01)

(52) U.S. Cl.
CPC ...... *H01L 27/3211* (2013.01); *H01L 51/5284* (2013.01); *H01L 2251/558* (2013.01)

(58) Field of Classification Search
CPC ............. H01L 51/5218; H01L 51/5284; H01L 27/3211
See application file for complete search history.

(56) References Cited

U.S. PATENT DOCUMENTS

| 4,251,610 A * | 2/1981 | Haven et al. ................... 430/25 |
| 6,387,545 B1 * | 5/2002 | Liu ....................... C07C 211/54 |
| | | 313/504 |
| 2002/0038860 A1 * | 4/2002 | Tsuboyama et al. ..... 252/301.16 |
| 2003/0190763 A1 * | 10/2003 | Cok et al. ....................... 438/22 |
| 2003/0230972 A1 * | 12/2003 | Cok ................... H01L 27/3211 |
| | | 313/504 |
| 2005/0179368 A1 * | 8/2005 | Ryu .................... H01L 51/5284 |
| | | 313/504 |
| 2005/0242713 A1 * | 11/2005 | Yamazaki ........... H01L 51/5284 |
| | | 313/503 |
| 2005/0285518 A1 * | 12/2005 | Cok .............................. 313/512 |
| 2007/0176538 A1 * | 8/2007 | Winters et al. ............... 313/504 |

(Continued)

*Primary Examiner* — Thao X Le
*Assistant Examiner* — Laura Dykes
(74) *Attorney, Agent, or Firm* — Cooper Legal Group, LLC

(57) ABSTRACT

An organic light-emitting diode (OLED) display and fabrication method thereof are provided. The OLED display includes an organic light-emitting layer comprising a plurality of primary color regions and a plurality of mixed color regions, wherein the primary color regions and the mixed color regions have the same light emitting direction. A color shift prevention layer is disposed above or under the organic light-emitting layer, the color shift prevention layer comprising a plurality of opaque patterns disposed on the light emitting direction of the corresponding mixed color regions. The color shift prevention layer incorporated in the OLED display is able to block the mixed light emitted from the mixed color regions of the organic light-emitting layer. Therefore, the color shift problem can be solved.

19 Claims, 6 Drawing Sheets

(56) References Cited

U.S. PATENT DOCUMENTS

| | | | | |
|---|---|---|---|---|
| 2013/0043475 A1* | 2/2013 | Kim | ................. | H01L 29/78633 |
| | | | | 257/59 |
| 2013/0134449 A1* | 5/2013 | Chen | ................. | H01L 27/3279 |
| | | | | 257/88 |
| 2014/0027725 A1* | 1/2014 | Lim et al. | ....................... | 257/40 |

* cited by examiner

ORGANIC LIGHT-EMITTING DIODE DISPLAY AND FABRICATION METHOD THEREOF

BACKGROUND OF THE INVENTION

This Application claims priority of China Patent Application No. CN 201310409769.4, filed on Sep. 9, 2013, and the entirety of which is incorporated by reference herein.

Field of the Invention

The present invention generally relates to display device. More particularly, the present invention relates to an organic light-emitting diode (OLED) display and fabrication method thereof.

Description of the Prior Art

Organic light emitting diode display (OLED display) has long been considered to be the most competitive one of the next generation display technologies, with the advantages including self-luminous without needing a backlight module, faster response, and lower operating voltage.

A general OLED display has self-emission characteristics and uses an organic material layer composed of an organic material. When a current is applied and the current passes through the organic material layer, the organic material in the organic material layer emits light. With different organic materials, OLED display can emit light of different colors to achieve multi-color or full color displays.

Currently, the organic material layer of an OLED display can be formed by vapor depositing red (R), green (G), blue (B) color organic material layer with a vapor deposition apparatus. The vapor deposition apparatus has a mask with a plurality of openings corresponding to a plurality of pixel regions on the organic material layer. In the vapor deposition process, the organic material of one specific color of the three primary colors R, G, B, for example red color (R), is vapor deposited onto the pre-selected pixel region through the openings of the mask. Thereafter, the mask is shifted to another pixel region, and the vapor deposition process is repeated to sequentially form the rest colors (G, B) of the organic materials through the openings of the mask.

However, during the vapor deposition process, residual organic material remains near the openings of the mask. The residual organic material has a weight, and over time, the weight of the residual organic material deforms the mask and changes the shape of the openings, resulting in insufficient mask alignment accuracy, which leads to mixed color regions in the organic material layer and color shift problems.

BRIEF SUMMARY OF THE INVENTION

In view of those problems described above, the present invention provides a color shift prevention layer in the organic light emitting diode display to solve the above-described color shift even the presence of mixed color region.

In one aspect, the present invention provides an organic light-emitting diode (OLED) display, comprising: an organic light-emitting layer comprising a plurality of primary color regions and a plurality of mixed color regions, wherein the primary color regions and the mixed color regions have the same light emitting direction; and a color shift prevention layer disposed above or under the organic light-emitting layer, the color shift prevention layer comprising a plurality of opaque patterns disposed on the light emitting direction of the corresponding mixed color regions.

In another aspect, the present invention provides a method for fabricating an organic light-emitting diode (OLED) display, comprising: forming an organic light-emitting layer comprising a plurality of primary color regions and a plurality of mixed color regions, wherein the primary color regions and the mixed color regions have the same light emitting direction; and forming a color shift prevention layer above or under the organic light-emitting layer, wherein the color shift prevention layer comprises a plurality of opaque patterns disposed on the light emitting direction of the corresponding mixed color regions.

It is advantageous to use the invention because the color shift prevention layer incorporated in the OLED display is able to shield and block the mixed light emitted from the mixed color regions of the organic light-emitting layer. Therefore, the color shift problem can be solved.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

In the following detailed description of the invention, reference is made to the accompanying drawings which form a part hereof, and in which is shown, by way of illustration, specific embodiments in which the invention can be practiced. These embodiments are described in sufficient detail to enable those skilled in the art to practice the invention. Other embodiments can be utilized and structural, logical, and electrical changes can be made without departing from the scope of the present invention. The following detailed description is, therefore, not to be taken in a limiting sense, and the included embodiments are defined by the appended claims. Furthermore, the orientation "up" and "down", are only used to indicate the relative positional relationship between the components, are not intended to limit the invention.

Now, several embodiments will be provided hereinafter with reference to the drawings illustrate the process of the invention. FIGS. 1-4 are schematic, cross-sectional diagrams illustrating a method for making an organic light-emitting diode (OLED) display in accordance with one embodiment of the invention. FIGS. 5-11 show various embodiments of the invention OLED display.

The invention provides a method for fabricating an OLED display. The method comprises: providing an organic light-emitting layer having a plurality of primary color regions and a plurality of mixed color regions, wherein the primary color regions and the mixed color regions have the same light-emitting direction; and providing a color shift prevention layer above or below the organic light-emitting layer. The color shift prevention layer includes a plurality of opaque patterns corresponding to the mixed color regions. The opaque patterns are disposed on the light-emitting direction of the corresponding mixed color regions.

In one embodiment, before the organic light-emitting layer is formed, an upper substrate and lower substrate are provided. A cathode layer and an anode layer are disposed between the upper substrate and the lower substrate and are spaced apart from each other. The organic light-emitting layer is disposed between the cathode layer and the anode layer.

The present invention method for making the OLED display will be described more fully hereinafter with reference to the accompanying drawings, in which preferred embodiments of the invention are shown.

It is to be understood that the aforesaid light emitting direction of the OLED display can be either the A1 direction wherein the emitted light travels in the A1 direction penetrates the upper substrate, or the A2 direction (opposite to the A1 direction) wherein the emitted light travels in the A2 direction penetrates the lower substrate. In the following exemplary embodiment, the aforesaid light emitting direction of the OLED display 10 is the A1 direction.

Figure 1:
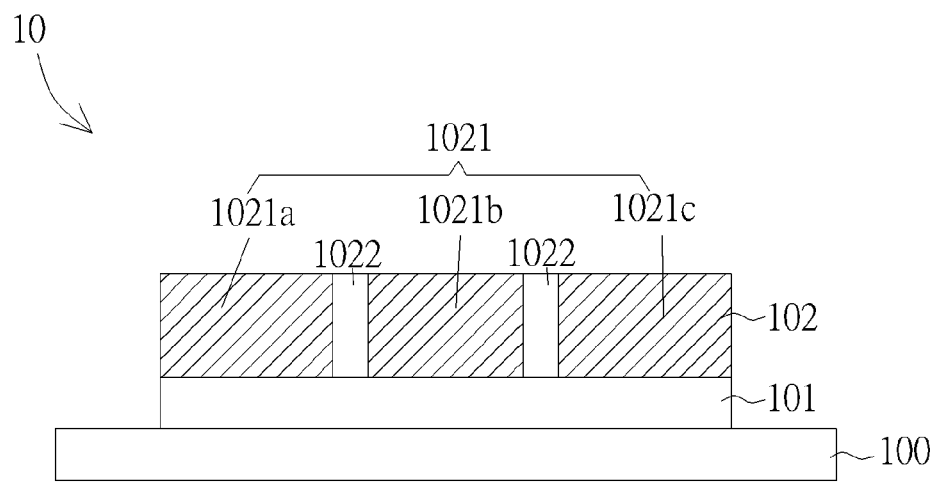
FIGS. 1-4 are schematic, cross-sectional diagrams illustrating a method for making an organic light-emitting diode (OLED) display in accordance with one embodiment of the invention.

As shown in FIG. 1, first, a lower substrate 100 is provided to function as a base of the organic light-emitting diode structure. For example, the lower substrate 100 can be a transparent glass substrate, a plastic sheet, or any suitable material with ability to support elements. According to the embodiment, the lower substrate 100 can be a reinforced substrate or sheet material. An anode layer 101 is then formed on a main surface of the lower substrate 100 or on the lower substrate 100. The anode layer 101 can comprise transparent conductive oxide (TCO) including but not limited to indium tin oxide (ITO), zinc oxide (ZnO), or aluminum doped zinc oxide (AZO). The anode layer 101 can comprise an opaque layer of metal, for example, nickel (Ni), gold (Au), molybdenum (Mo), or platinum (Pt), which can be formed on the lower substrate 100 by using sputtering or vapor depositing methods.

After forming the anode layer 101, an organic light-emitting layer (EML) 102 is formed on the anode layer 101. The organic light-emitting layer 102 comprises a plurality of primary color regions 1021, for example, red color region 1021a, green color region 1021b, and blue color region 1021c. Depending upon the required emission color of each of the primary color regions 1021, the organic light-emitting layer 102 can comprise different materials or dopants, for example, red color dyes for the red color region 1021a including but not limited to 4-(Dicyanomethylene)-2-methyl-6-(4-dimethylaminostyryl)-4H-pyran (DCM), DCM-2, or 4-(Dicyanomethylene)-2-tert-butyl-6-(1,1,7,7-tetramethyljulolidin-4-yl-vinyl)-4H-pyran (DCJTB), green color dyes for the green color region 1021b including but not limited to (8-hydroxyquinoline) aluminum (Alq), tris-(8-hydroxyquinoline)aluminum (Alq3), or N,N'-Dimethyl-quinacridone (DMQA), and blue color dyes for the blue color region 1021c including but not limited to anthracene, Alq2, 4,4"-bis(9-ethyl-3-carbazovinylene)-1,1"-biphenyl (BCz-VBi), perylene, oxadiazole (OXD), or bis(2,2 diphenylvinyl)benzene (DPVB). The organic light-emitting layer 102 can be formed by using conventional vapor deposition apparatus that uses a mask to vapor deposit the aforesaid red, green, and blue color fluorescent dye materials, thereby forming the red color region 1021a, green color region 1021b, and blue color region 1021c. However, during the vapor deposition process, residual organic material remains near the openings of the mask. The residual organic material has a weight, and over time, the weight of the residual organic material deforms the mask and changes the shape of the openings, resulting in insufficient mask alignment accuracy, which leads to mixed color regions 1022 in the organic light-emitting layer 102 and color shift problems.

Figure 2:
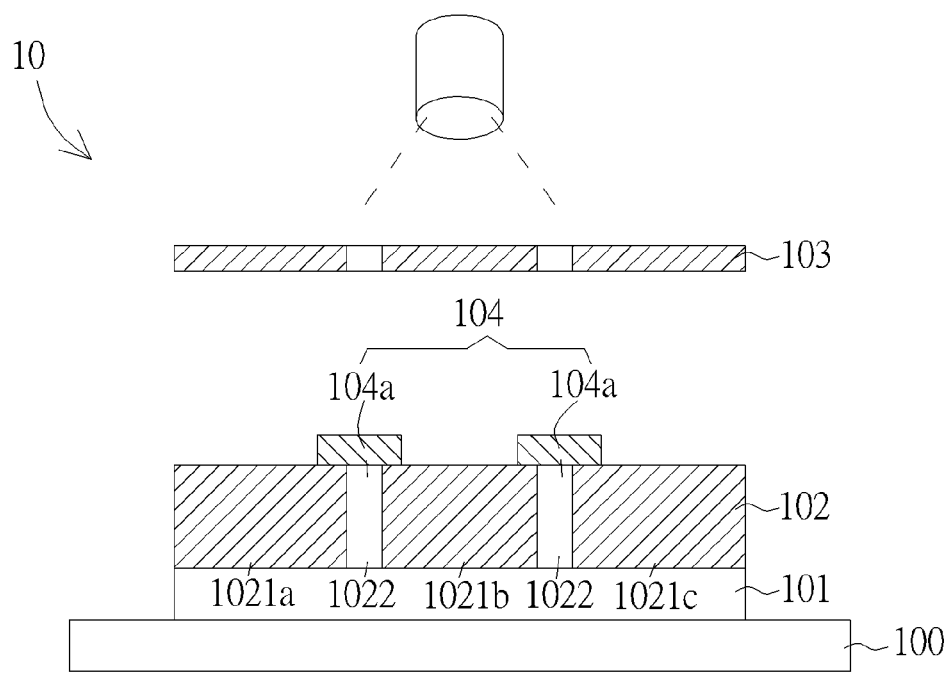

As shown in FIG. 2, after forming the organic light-emitting layer 102, a mask 103 can be disposed on (or under) the organic light-emitting layer 102. Through the mask 103, a vapor depositing process or a sputtering process is carried out to form a color shift prevention layer 104 on the organic light-emitting layer 102. The color shift prevention layer 104 comprises a plurality of opaque patterns 104a corresponding to the aforesaid mixed color regions 1022. The opaque patterns 104a can be made of photosensitive resins, or an opaque, black chrome film, but not limited thereto.

In other embodiments, the opaque patterns 104a can be formed by using other suitable processes, for example, first coating a photosensitive resin layer, and then patterning the photosensitive resin layer by using photolithographic and etching processes including UV exposure and development processes. Alternatively, a black chrome film can be first sputtered onto the organic light-emitting layer 102, and then photolithographic and etching processes can be performed to pattern the black chrome film, thereby forming the opaque patterns 104a.

In another embodiment, the opaque patterns 104a can be composed of light absorbing materials, for example, graphene, chrome oxide, or titanium oxide, which can be formed by using photolithographic and etching processes.

Figure 3:
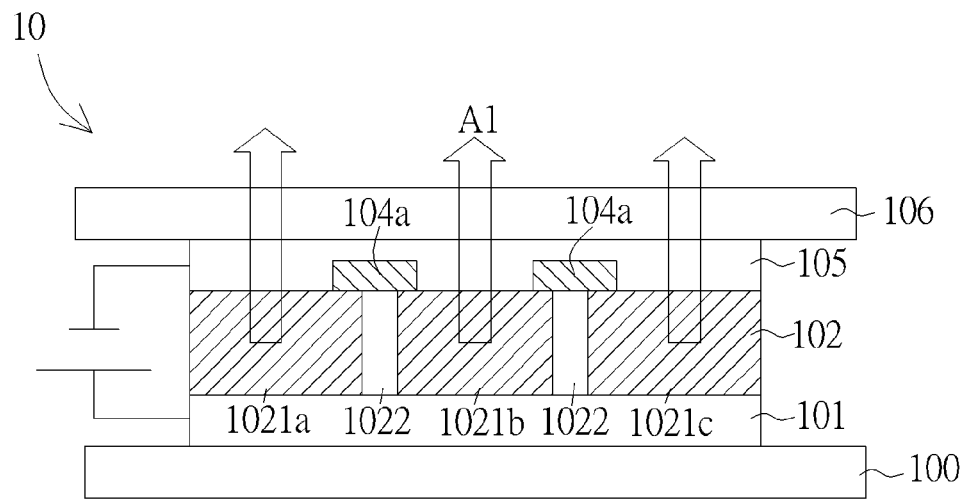

As shown in FIG. 3, a cathode layer 105 is formed on the color shift prevention layer 104. The cathode layer 105 is used to generate electrons and can comprise metals with relatively lower work function, for example, alkali metals, alkaline earth metals, or lanthanide metals. An upper substrate 106 is disposed on the cathode layer 105 to protect the entire device structure. The upper substrate 106 can be a transparent glass, plastic sheet, or any suitable protective materials. After forming the upper substrate 106, the fabrication of the main structure of OLED display 10 is complete.

As shown in FIG. 3, when a current is applied, the anode layer 101 injects holes and the cathode layer 105 injects electrons into the organic light-emitting layer 102. The injected holes and electrons can recombine to form a localized electron-hole pair having an excited energy state. Light is emitted when the exciton relaxes via a photoemissive mechanism. The mixed light emitted from the mixed color regions 1022 in the organic light-emitting layer 102 is blocked by the corresponding opaque patterns 104a disposed on the mixed color regions 1022, thereby eliminating the color shift.

It is to be understood that the light emitting direction of the OLED display 10 depends upon the materials of the anode layer 101 and the materials of the cathode layer 105.

In one embodiment, the anode layer 101 can be an indium tin oxide layer or an indium zinc oxide layer with a thickness of about 50 nm~300 nm, and the cathode layer 105 can be an aluminum layer with a thickness of about 150 um~200 um. In such case, the anode layer 101 is a light transmissive layer, while the cathode layer 105 is a light reflective layer. The light emitting direction of the OLED display 10 is the A2 direction and light escapes from the lower substrate 100, as depicted through FIGS. 8-11. According to this embodiment, the color shift prevention layer 104 is disposed between the organic light-emitting layer 102 and the lower substrate 100.

In another embodiment, the anode layer 101 can be an aluminum layer with a thickness of about 150 nm~200 nm or a gold layer with a thickness of about 100 nm~150 nm, and the cathode layer 105 can be an aluminum layer with a thickness of about 0.1 nm~20 nm, a silver layer with a thickness of about 0.1 nm~20 nm, or an indium zinc oxide layer or indium tin oxide layer with a thickness of about 20 nm~100 nm. In such case, the anode layer 101 is a light reflective layer, while the cathode layer 105 is a light transmissive layer. The light emitting direction of the OLED display 10 is the A1 direction and light emitted from the organic light-emitting layer 102 escapes from the upper substrate 106, as depicted through FIGS. 3-7. According to this embodiment, the color shift prevention layer 104 is disposed between the organic light-emitting layer 102 and the upper substrate 106.

In the above-described embodiments, additional layers can be disposed in the OLED display 10 between the anode layer 101 and the organic light-emitting layer 102 to enhance the luminous efficiency, which are shown in the next figures.

Figure 4:
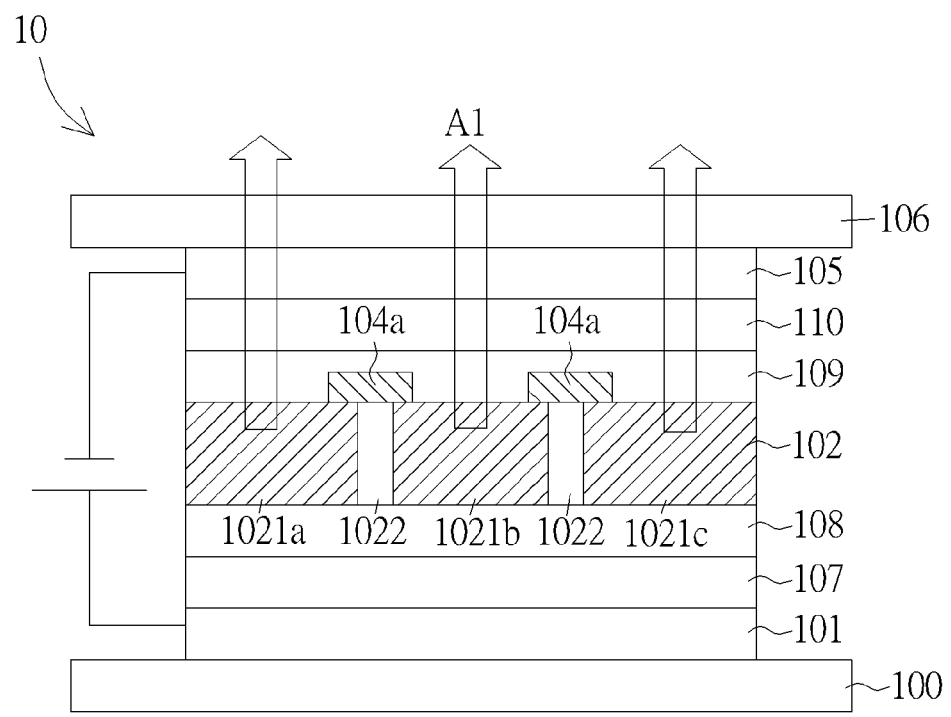

As shown in FIG. 4, the anode layer 101 is formed on the lower substrate 100. A hole injection layer (HIL) 107 is formed on the anode layer 101. The hole injection layer 107 can comprise a material having a highest occupied molecular orbital (HOMO) energy that matches the work function of the anode layer 101. For example, the hole injection layer 107 can comprise copper phthalocyanine (CuPc), TiOPc, 4,4',4''-tris(3-methylphenylphenylamino)triphenylamine (m-MTDATA), 4,4',4''-tris(2-naphthylphenylamino)triphenylamine (2-TNATA), or poly(3,4-ethylenedioxythiophene)-poly(styrenesulfonate) (PEDOT-PSS). The hole injection layer 107 can be formed on the anode layer 101 by using vapor depositing, spin coating, or blade coating methods, for example. The hole injection layer 107 can increase the charge injection at the interface, thereby improving luminance efficiency of the OLED display.

After forming the hole injection layer 107, a hole transport layer (HTL) 108 is formed on the hole injection layer 107. The hole transport layer 108 can comprise thin film material with high hole mobility and high thermal stability, for example, naphtha-phenylene benzidine (NPB), N,N'-diphenyl-N,N'-di(3-methyl phenyl)-1,1'-biphenyl-4,4'-diamine (TPD), or poly(9-vinyl carbazole) (PVK). The hole transport layer 108 can be formed on the hole injection layer 107 by using vapor depositing, spin coating, or blade coating methods. The hole transport layer 108 is used to increase the transportation speed of the holes, thereby improving the luminous efficiency.

The primary color regions 1021 and the mixed color regions 1022 have the same light emitting direction. The color shift prevention layer 104 is then formed on the organic light-emitting layer 102. The color shift prevention layer 104 comprises a plurality of opaque patterns 104a corresponding to the aforesaid mixed color regions 1022. The opaque patterns 104a are disposed on the light emitting direction of the mixed color regions 1022 to block the mixed light. An electron transport layer (ETL) 109 is formed on the color shift prevention layer 104. The electron transport layer 109 can help the electrons injected from the cathode smoothly transferred to the organic light-emitting layer 102 and block the holes from moving to the cathode. The material of the electron transport layer 109 should have the characteristics of high electron mobility and an energy barrier for blocking holes. The suitable materials for the electron transport layer 109 can comprise 2-(4-biphenyl)-5-(4-tert-butylphenyl)-1,3,4-oxadiazole (PBD), OXD, 3-(biphenyl4-yl)-4-phenyl-5-(4-tert-butylphenyl)-4H-1,2,4-triazole (TAZ), or Alq3. The electron transport layer 109 can be formed on the color shift prevention layer 104 by using vapor depositing, spin coating, or blade coating methods.

An electron injection layer (EIL) 110 can be formed on the electron transport layer 109 to improve electron injection. A suitable material of the electron injection layer 110 can comprise a material, for example, LiF, LiO$_3$, or LiBO$_2$, which has a lowest unoccupied molecular orbital (LUMO) energy that matches the work function of the cathode layer 105. The cathode layer 105 is then formed on the electron injection layer 110. Finally, the upper substrate 106 such as a transparent glass, a plastic sheet, or a protective material is provided on the cathode layer 105 to act as a protection layer of the entire device structure.

In one embodiment, the main structure of the OLED display 10 is depicted in FIG. 3, wherein the anode layer 101 of the OLED display 10 is light reflective type and the cathode layer 105 is light transmissive type. The OLED display 10 has a light emitting direction A1 and the light escapes from the upper substrate 106. The anode layer 101 is formed on the lower substrate 100. The organic light-emitting layer 102 comprising the primary color regions 1021 and the mixed color regions 1022 is formed on the anode layer 101. The color shift prevention layer 104 comprising the opaque patterns 104a corresponding to the mixed color regions 1022 is formed on the organic light-emitting layer 102. The cathode layer 105 is formed on the color shift prevention layer 104. The upper substrate 106 is formed on the cathode layer 105.

In another embodiment, the main structure of the OLED display 10 is depicted in FIG. 4, wherein the anode layer 101 of the OLED display 10 is light reflective type and the cathode layer 105 is light transmissive type. The OLED display 10 has a light emitting direction A1 and the light escapes from the upper substrate 106. The anode layer 101 is formed on the lower substrate 100. The hole injection layer 107 is formed on the anode layer 101. The hole transport layer 108 is formed on the hole injection layer 107. The organic light-emitting layer 102 comprising the primary color regions 1021 and the mixed color regions 1022 is formed on the hole transport layer 108. The color shift prevention layer 104 comprising the opaque patterns 104a corresponding to the mixed color regions 1022 is formed on the organic light-emitting layer 102. The electron transport layer 109 is formed on the color shift prevention layer 104. The electron injection layer 110 is formed on the electron transport layer 109. The cathode layer 105 is formed on the electron injection layer 110. The upper substrate 106 is formed on the cathode layer 105.

It is to be understood that the above-described embodiments are only for illustration purposes. In other embodiments, depending upon the light emitting direction of the OLED display 10, the color shift prevention layer 104 can be disposed in different positions to block the mixed light emitted from the mixed color regions 1022. FIGS. 5-11 illustrate various positions of the color shift prevention layer 104 in the OLED display 10 in cross-sectional views according to this invention.

Figure 5:
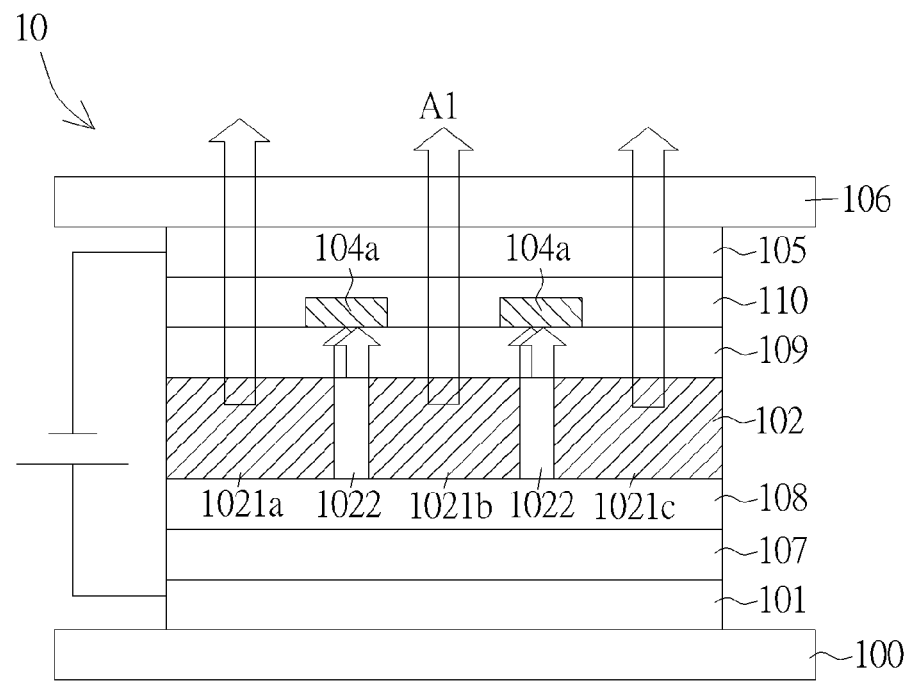
FIGS. 5-11 show various embodiments of the invention OLED display.
Figure 6:
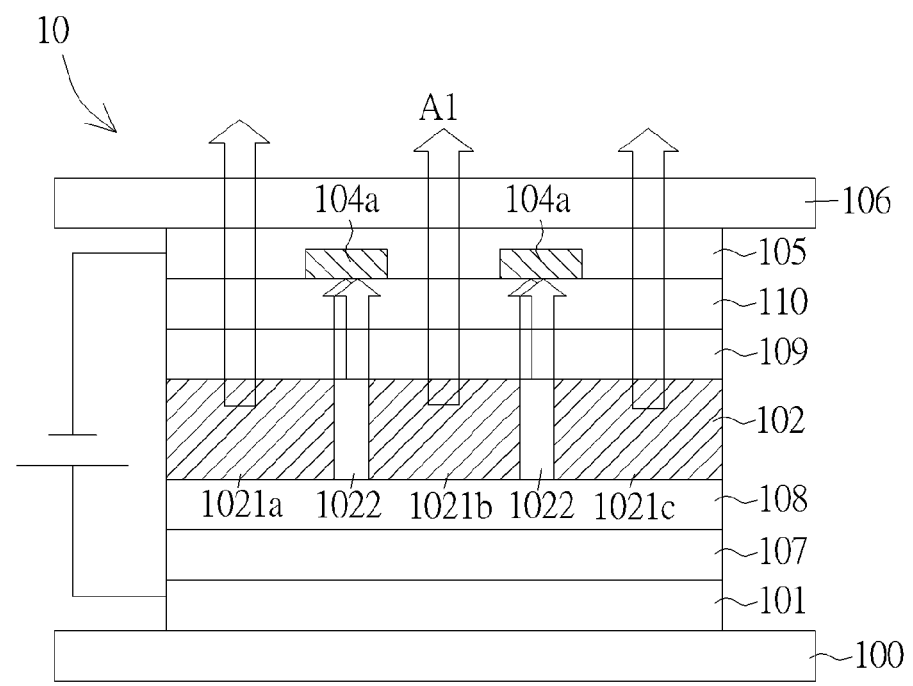
Figure 7:
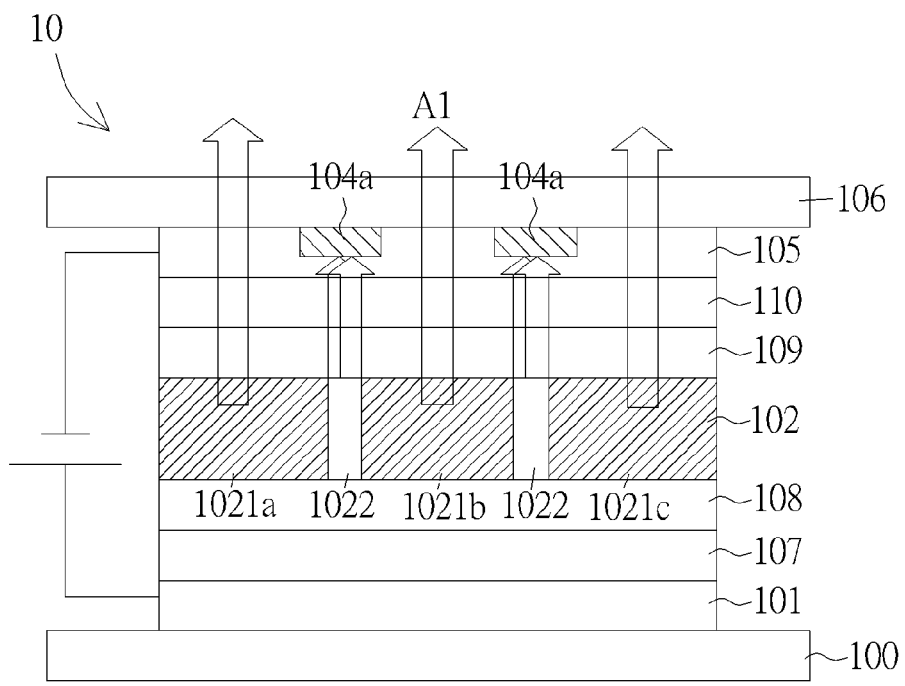

According to one embodiment, as indicated by the light emitting direction A1, the light escapes from the upper substrate 106, wherein the color shift prevention layer 104 is disposed between the organic light-emitting layer 102 and the upper substrate 106. More specifically, the color shift prevention layer 104 can be disposed between the electron transport layer 109 and the electron injection layer 110 as depicted in FIG. 5, between the electron injection layer 110 and the cathode layer 105 as depicted in FIG. 6, or between the cathode layer 105 and the upper substrate 106 as depicted in FIG. 7. In these positions, the color shift prevention layer 104 is able to block the mixed light emitted from the mixed color regions 1022, thereby preventing color shift problem.

Figure 8:
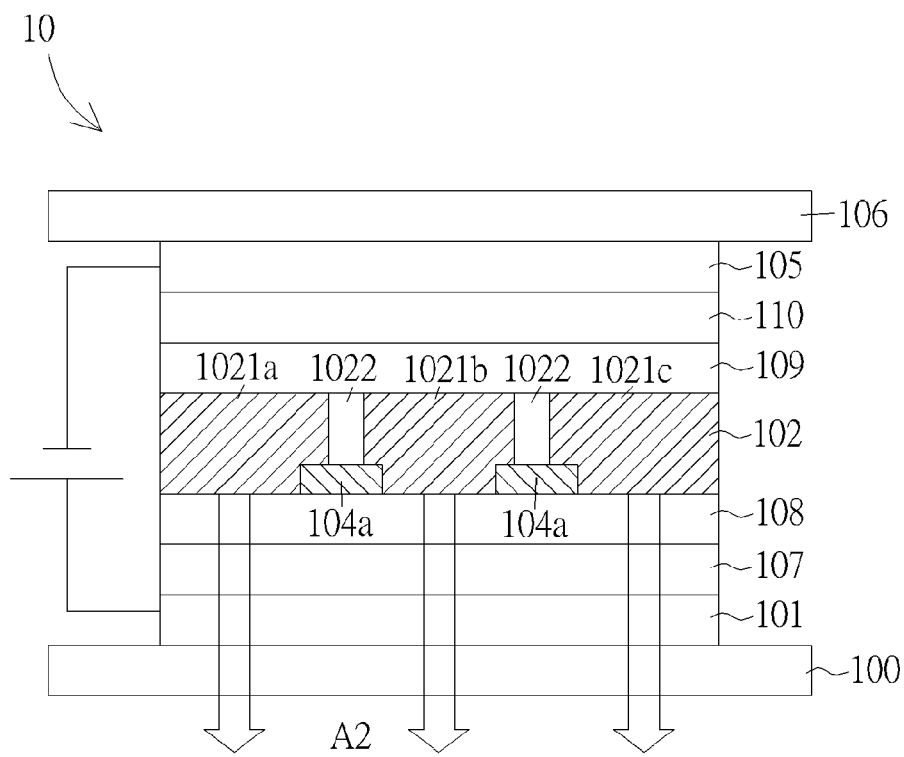
Figure 9:
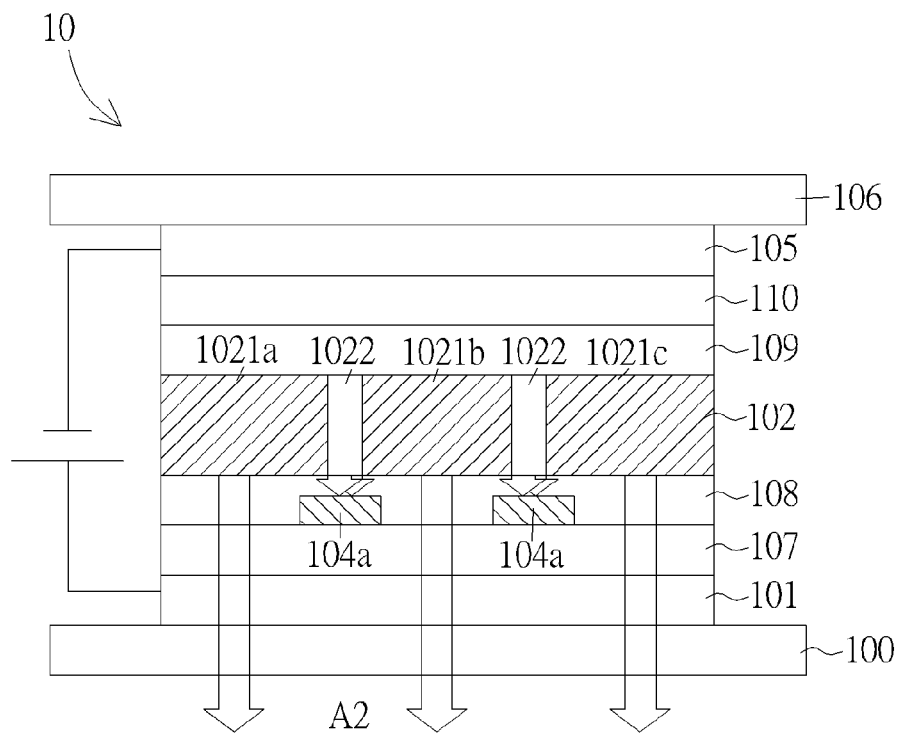
Figure 10:
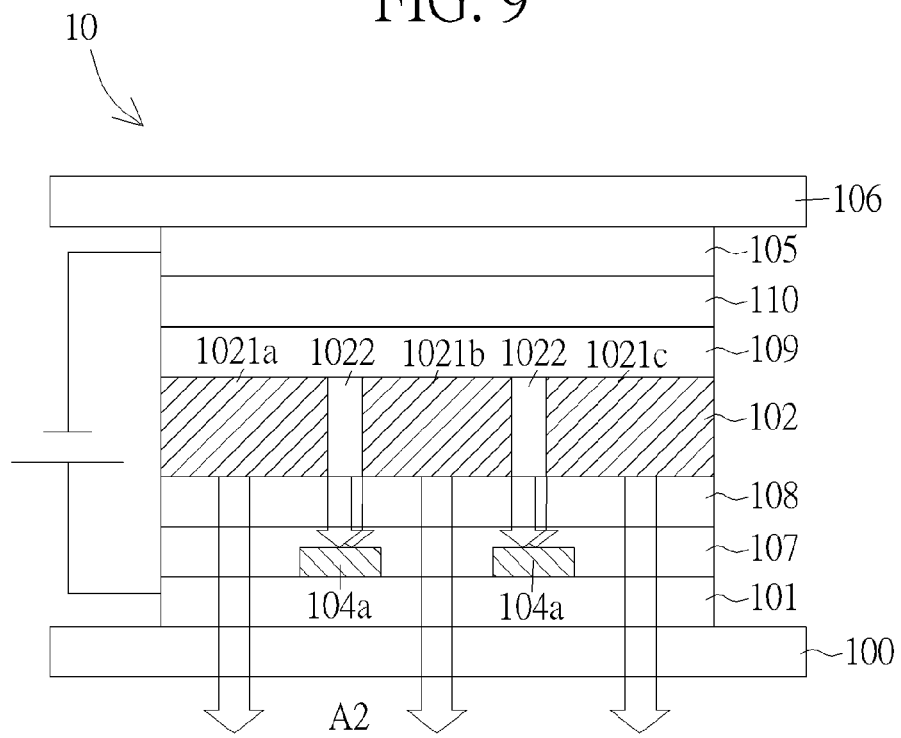
Figure 11:
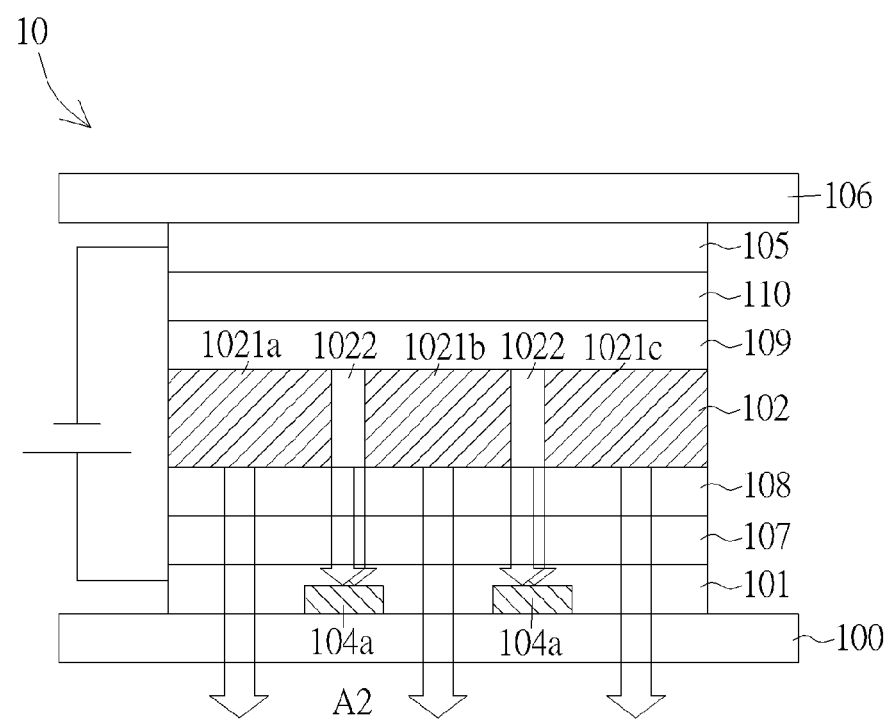

According to another embodiment, as indicated by the light emitting direction A2, the light escapes from the lower substrate 100, wherein the color shift prevention layer 104 is disposed between the organic light-emitting layer 102 and the lower substrate 100. More specifically, the color shift prevention layer 104 can be disposed between the organic light-emitting layer 102 and the hole transport layer 108 as depicted in FIG. 8, between the hole transport layer 108 and the hole injection layer 107 as depicted in FIG. 9, between the hole injection layer 107 and the anode layer 101 as depicted in FIG. 10, or between the anode layer 101 and the lower substrate 100 as depicted in FIG. 11. In these positions, the color shift prevention layer 104 is able to block the mixed light emitted from the mixed color regions 1022, thereby preventing color shift problem.

It is noteworthy that the shape of the opaque patterns 104a of the color shift prevention layer 104 should not be limited to the rectangular shape as set forth in the figures. The opaque patterns 104a can have other shapes such as rhombus, trapezoid, funnel shapes so long as the opaque patterns 104a are able to completely or partially shield the mixed color regions 1022 of the organic light-emitting layer 102.

Further, according to the invention, the light emitting direction of the OLED display is not limited to the light emitting direction A1 and the light emitting direction A2 shown in the figures.

It is advantageous to use the invention because the color shift prevention layer 104 incorporated in the OLED display 10 is able to shield and block the mixed light emitted from the mixed color regions 1022 of the organic light-emitting layer 102. Therefore, the color shift problem can be solved and the production yield can be significantly improved.

Those skilled in the art will readily observe that numerous modifications and alterations of the device and method can be made while retaining the teachings of the invention. Accordingly, the above disclosure should be construed as limited only by the metes and bounds of the appended claims.

What is claimed is:

1. An organic light-emitting diode (OLED) display, comprising:
   an organic light-emitting layer comprising a plurality of primary color regions and a plurality of mixed color regions, wherein:
      each primary color region is formed by a material corresponding to one kind of primary color, and
      each mixed color region is formed by a mixture of at least two materials corresponding to at least two kinds of primary colors, wherein the at least two kinds of primary colors are present in the entirety of the mixed color region; and
   a color shift prevention layer having a plurality of opaque patterns, wherein the opaque patterns are disposed over corresponding mixed color regions in a light emitting direction of the OLED display and directly contact the corresponding mixed color regions to block mixed light emitted from the mixed color regions.

2. The OLED display according to claim 1 further comprising:
   an upper substrate and a lower substrate; and
   a cathode layer and an anode layer, wherein:
      the cathode layer and the anode layer are disposed between the upper substrate and the lower substrate, and
      the organic light-emitting layer is disposed between the cathode layer and the anode layer.

3. The OLED display according to claim 2 wherein:
   the anode layer is a light reflective layer and the cathode layer is a light transmissive layer, and
   light is emitted from the mixed color regions towards the cathode layer.

4. The OLED display according to claim 3 wherein:
   the light reflective layer comprises an aluminum layer with a thickness of about 150 nm~200 nm or a gold layer with a thickness of about 100 nm~150 nm, and
   the light transmissive layer comprises an aluminum layer with a thickness of about 0.1 nm~20 nm, a silver layer with a thickness of about 0.1 nm~20 nm, an indium zinc oxide layer with a thickness of about 20 nm~100 nm, or indium tin oxide with a thickness of about 20 nm~100 nm.

5. The OLED display according to claim 3, wherein the OLED display further comprises:
   an electron transport layer formed on the color shift prevention layer; and
   an electron injection layer formed on the electron transport layer, wherein:
      the cathode layer is formed on the electron injection layer,
      the upper substrate is disposed on the cathode layer, and
      the color shift prevention layer is formed on the organic light-emitting layer, the color shift prevention layer being between the electron transport layer and the organic light-emitting layer.

6. The OLED display according to claim 3 wherein:
   the light reflective layer comprises an aluminum layer with a thickness of about 150 nm~200 nm or a gold layer with a thickness of about 100 nm~150 nm, and
   the light transmissive layer comprises an aluminum layer with a thickness of about 0.1 nm~20 nm or a silver layer with a thickness of about 0.1 nm~20 nm.

7. The OLED display according to claim 1 wherein the opaque patterns comprise photosensitive resins or black chrome film.

8. The OLED display according to claim 1 wherein the opaque patterns comprise graphene, chrome oxide, or titanium oxide.

9. The OLED display according to claim 1 wherein the opaque patterns comprise graphene or titanium oxide.

10. The OLED display according to claim 1 wherein the mixture of the at least two materials extends continuously from an interface with a first primary color region to an interface with a second primary color region.

11. A method for fabricating an organic light-emitting diode (OLED) display, comprising:
   forming an organic light-emitting layer comprising a plurality of primary color regions and a plurality of mixed color regions, wherein:
      each primary color region is formed by a material corresponding to one kind of primary color, and
      each mixed color region is formed by a mixture of at least two materials corresponding to at least two kinds of primary colors, wherein the at least two kinds of primary colors are present in the entirety of the mixed color region; and
   forming a color shift prevention layer, wherein the color shift prevention layer comprises a plurality of opaque patterns disposed over corresponding mixed color regions in a light emitting direction of the OLED display and directly contacting the corresponding mixed color regions to block mixed light emitted from the mixed color regions.

12. The method according to claim 11 further comprising:
   providing an upper substrate and a lower substrate; and forming a cathode layer and an anode layer, wherein:
  the cathode layer and the anode layer are disposed between the upper substrate and the lower substrate, and
  the organic light-emitting layer is disposed between the cathode layer and the anode layer.

13. The method according to claim 12 wherein:
the anode layer is a light reflective layer and the cathode layer is a light transmissive layer, and
light is emitted from the mixed color regions towards the cathode layer.

14. The method according to claim 13, wherein the method further comprises:
  forming an electron transport layer on the color shift prevention layer; and
  forming an electron injection layer on the electron transport layer, wherein:
    the cathode layer is formed on the electron injection layer,
    the upper substrate is disposed on the cathode layer, and
    the color shift prevention layer is formed on the organic light-emitting layer.

15. The method according to claim 11 wherein the opaque patterns comprise photosensitive resins, a black chrome film, or a metal film.

16. The method according to claim 11 wherein the opaque patterns comprise graphene, chrome oxide, or titanium oxide.

17. The method according to claim 11 wherein the opaque patterns are formed by:
  coating a photosensitive resin layer; and
  performing photolithographic and etching processes to pattern the photosensitive resin layer.

18. The method according to claim 11 wherein the opaque patterns are formed by:
  sputtering a black chrome film; and
  performing photolithographic and etching processes to pattern the black chrome film.

19. The method according to claim 11 wherein the mixture of the at least two materials extends continuously from an interface with a first primary color region to an interface with a second primary color region.

* * * * *